United States Patent
Kageyama et al.

(10) Patent No.: US 7,778,297 B2
(45) Date of Patent: Aug. 17, 2010

(54) SURFACE EMITTING LASER ELEMENT AND METHOD OF FABRICATING THE SAME

(75) Inventors: Takeo Kageyama, Tokyo (JP); Norihiro Iwai, Tokyo (JP); Yasumasa Kawakita, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 321 days.

(21) Appl. No.: 12/056,790

(22) Filed: Mar. 27, 2008

(65) Prior Publication Data
US 2009/0310637 A1    Dec. 17, 2009

(30) Foreign Application Priority Data
Mar. 29, 2007   (JP) .............................. 2007-089419

(51) Int. Cl.
*H01S 5/00* (2006.01)
(52) U.S. Cl. .............. 372/43.01; 372/45.01; 372/46.01; 372/50.124
(58) Field of Classification Search .............. 372/43.01, 372/45.01, 50.123
See application file for complete search history.

(56) References Cited
U.S. PATENT DOCUMENTS
6,185,241 B1   2/2001  Sun 7,020,173 B2 *  3/2006  Yamamoto et al. ....... 372/45.01
2003/0185267 A1 * 10/2003  Hwang et al. ................. 372/96
2004/0252736 A1 * 12/2004  Nakayama et al. ............ 372/36

OTHER PUBLICATIONS

U.S. Appl. No. 12/040,348, filed Feb. 29, 2008, Shimizu et al.
U.S. Appl. No. 12/108,931, filed Apr. 24, 2008, Iwai et al.
D. L. Huffaker, et al. "Sub-40 uA Continuous-Wave Lasing in an Oxidized Vertical-Cavity Surface-Emitting Laser with Dielectric Mirrors", IEEE Photonics Technology Letters, vol. 8, No. 8, Aug. 1996, pp. 974-976.
N. Nishiyama, et al. "High Efficiency Long Wavelength VCSEL on InP Grown by MOCVD", Electronics Letters, vol. 39, No. 5, Mar. 6, 2003, 2 Pages.

* cited by examiner

*Primary Examiner*—Dung T Nguyen
(74) *Attorney, Agent, or Firm*—Oblon, Spivak, McClelland, Maier & Neustadt, L.L.P.

(57) ABSTRACT

A convex-portion forming layer is formed between a current-confinement aperture and a multilayer mirror, and forms a convex portion on each boundary between layers forming the multilayer mirror. The convex portion includes a plane equal to or larger than a spot size of the laser light, where the spot size is decided by a diameter of the current-confinement aperture, a predetermined diffraction angle of the laser light due to the current-confinement aperture, and a distance from the current-confinement aperture.

8 Claims, 4 Drawing Sheets

SURFACE EMITTING LASER ELEMENT AND METHOD OF FABRICATING THE SAME

CROSS-REFERENCE TO RELATED APPLICATIONS

The present application claims priority to and incorporates by reference the entire contents of Japanese priority document 2007-089419 filed in Japan on Mar. 29, 2007.

BACKGROUND OF THE INVENTION

1. Field of the Invention

The present invention relates to a surface emitting laser device and a method of manufacturing the surface emitting laser device.

2. Description of the Related Art

A vertical cavity surface emitting laser (surface emitting laser, hereinafter, "a surface emitting laser device") is used as a light source for optical communications such as an optical interconnection or a device for various applications. A plurality of surface emitting laser devices can be arranged in a two-dimensional array on a single substrate more easily than edge-emitting laser devices, because each surface emitting laser device emits a laser light in the vertical direction with respect to the substrate. Moreover, the surface emitting laser device has preferable properties, due to a small volume active layer, such as extremely low threshold current and laser oscillation at low consumption power.

In a typical surface emitting laser device, a distributed Bragg reflector (DBR) mirror, which is a multilayer mirror, is used in a resonator. It has been widely known that a dielectric DBR mirror as a dielectric multilayer mirror can reduce optical absorption loss, so that it is possible to obtain a high-power laser source, and there have been developed surface emitting laser devices including the dielectric DBR mirror in a resonator (see, for example, U.S. Pat. No. 6,185,241).

FIG. 6 is a cross section of the surface emitting laser device disclosed in U.S. Pat. No. 6,185,241. In the surface emitting laser device shown in FIG. 6, a light generated by an active layer 21 based on an injected current is resonated between a lower DBR mirror 22 and an upper DBR mirror 23, and is emitted as a laser light from an exit surface 23a on the upper DBR mirror 23. A spatial filter layer 24 is provided between the lower DBR mirror 22 and the upper DBR mirror 23. The laser light emitted from the exit surface 23a is diffracted by the spatial filter layer 24, and is transmitted through the upper DBR mirror 23 at a spreading angle (diffraction angle) depending on the diffraction.

In the surface emitting laser device shown in FIG. 6, an exit aperture 24a for forming a concave-shaped space is formed on a center portion of the spatial filter layer 24. The upper DBR mirror 23 is formed on the spatial filter layer 24 in the above state, so that a concave portion 23b is formed, along the concave shape of the exit aperture 24a, in the upper DBR mirror 23 above the exit aperture 24a. With this configuration, a marginal ray 25 of the laser light that has passed through the exit aperture 24a is scattered by a side-wall portion (tilt portion) of the concave portion 23b, which disadvantageously causes an optical intensity loss. Moreover, the scattered marginal ray causes disturbance in a Far Field Pattern of the laser light that is emitted from the exit surface 23a.

SUMMARY OF THE INVENTION

It is an object of the present invention to solve the above-described problems.

According to an aspect of the present invention, there is provided a surface emitting laser device that includes an active layer, a current confinement layer, and a multilayer mirror formed on a substrate, and emits a laser light through a current-confinement aperture of the current confinement layer and the multilayer mirror. The surface emitting laser device further includes a convex-portion forming layer that is formed between the current-confinement aperture and the multilayer mirror, and forms a convex portion on each boundary between layers forming the multilayer mirror. The convex portion includes a plane equal to or larger than a spot size of the laser light, where the spot size is decided by a diameter of the current-confinement aperture, a predetermined diffraction angle of the laser light due to the current-confinement aperture, and a distance from the current-confinement aperture.

Furthermore, according to another aspect of the present invention, there is provided a method of manufacturing a surface emitting laser device that includes an active layer, a current confinement layer, and a multilayer mirror formed on a substrate, and emits a laser light through a current-confinement aperture of the current confinement layer and the multilayer mirror. The method includes forming a convex-portion forming layer between the current-confinement aperture and the multilayer mirror to forms a convex portion on each boundary between layers forming the multilayer mirror, where the convex portion includes a plane equal to or larger than a spot size of the laser light, and the spot size is decided by a diameter of the current-confinement aperture, a predetermined diffraction angle of the laser light due to the current-confinement aperture, and a distance from the current-confinement aperture; and forming the multilayer mirror on the convex-portion forming layer.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Exemplary embodiments of the present invention are described in detail below with reference to the accompanying drawings.

Figure 1:
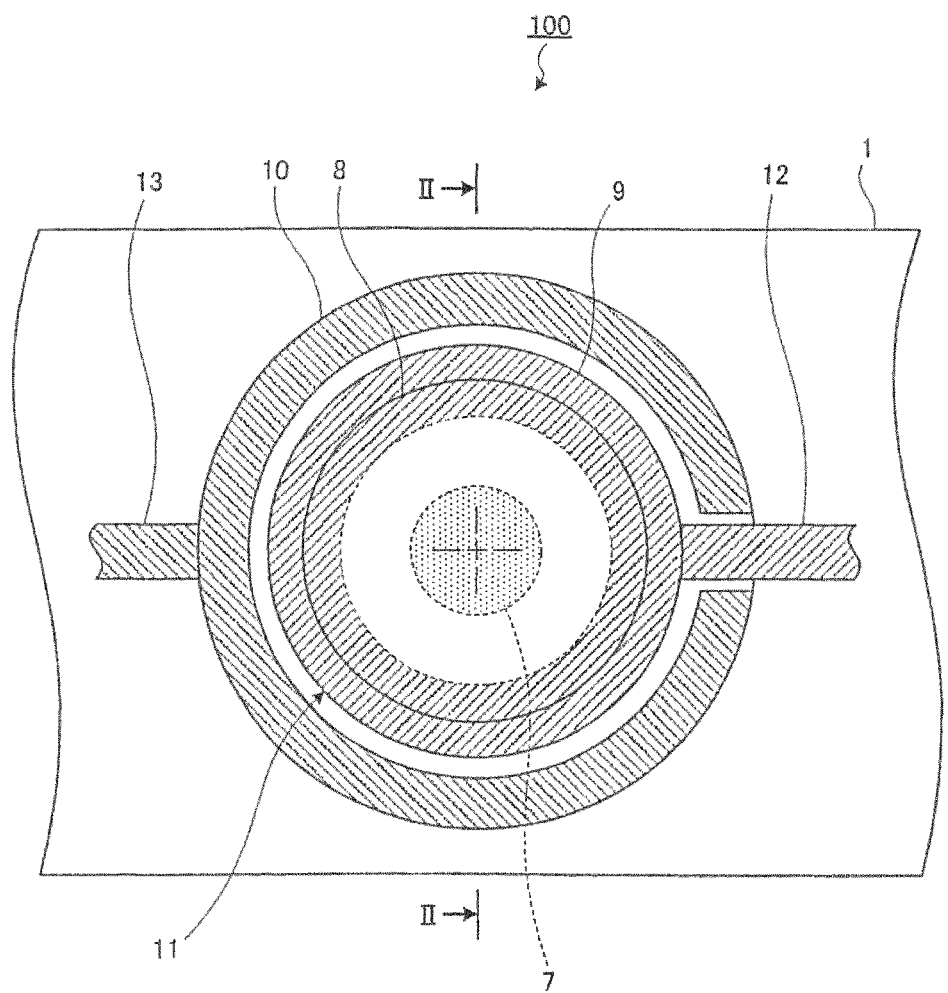
FIG. 1 is a top view of a surface emitting laser device according to an embodiment of the present invention.
Figure 2:
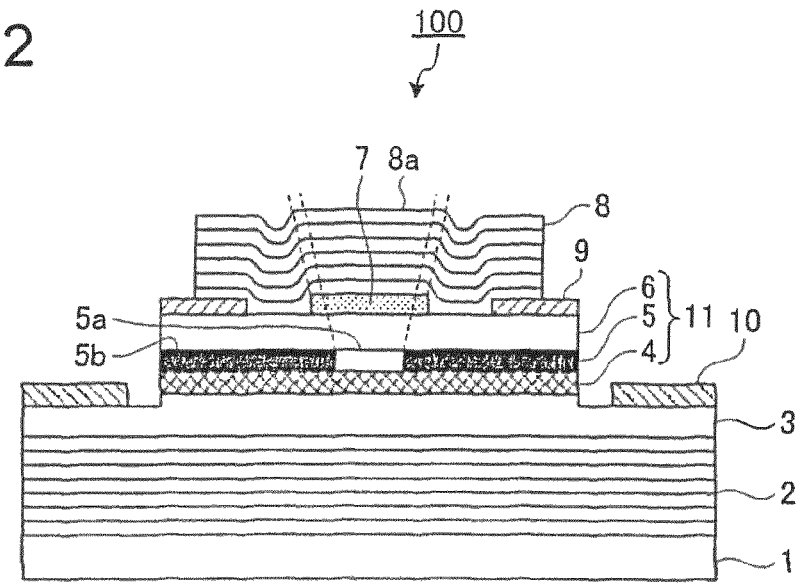
FIG. 2 is a cross section of the surface emitting laser device taken along a II-II line shown in FIG. 1.

FIG. 1 is a top view of a surface emitting laser device 100 according to an embodiment of the present invention. FIG. 2 is a cross section of the surface emitting laser device 100 taken along a II-II line shown in FIG. 1. As shown in FIGS. 1 and 2, the surface emitting laser device 100 includes a lower DBR mirror 2, an n-type cladding layer 3, an active layer 4, a current confinement layer 5, a p-type cladding layer 6, a spacer layer 7, an upper DBR mirror 8, a p-type electrode 9, and an n-type electrode 10 those formed on a semi-insulating substrate 1. An upper surface of the n-type cladding layer 3 and the active layer 4, the current confinement layer 5, and the p-type cladding layer 6 that are formed on the n-type cladding layer 3 are formed as a columnar mesa post 11 by etching or the like.

The lower DBR mirror 2 is formed with a plurality of layers of compound semiconductors such as AlAs/GaAs. Thickness of each of the layers forming the lower DBR mirror 2 is $\lambda/4n$, where $\lambda$ is oscillation wavelength and n is refractive index. The upper DBR mirror 8 is formed with a plurality of layers of dielectric materials such as $SiN/SiO_2$, and a thickness of each of the layers is $\lambda/4n$, which is equal to the layer thickness of the lower DBR mirror 2.

The current confinement layer 5 includes an aperture 5a as a current-confinement aperture and a selectively oxidized layer 5b. The current confinement layer 5 is formed with an Al-containing layer such as an AlAs layer. The selectively oxidized layer 5b is formed in a ring shape by oxidizing a predetermined range of the Al-containing layer from the outer circumference along the growth plane. The selectively oxidized layer 5b has an insulating property, and confines a current from the p-type electrode 9 inside the aperture 5a to increase the current density of the active layer 4 under the aperture 5a.

The active layer 4 of, for example, GaInNAs/GaAs has a three-layered quantum-well structure. The active layer 4 generates a spontaneous emission light due to the current injection from the p-type electrode 9 and confined by the current confinement layer 5. The spontaneous emission light is amplified by the resonator between the lower DBR mirror 2 and the upper DBR mirror 8 in a direction perpendicular to the layers including the active layer 4, and the amplified light is emitted as the laser light through an exit surface 8a. The exit surface 8a is a circular area formed on an upper surface of the upper DBR mirror 8 above the aperture 5a.

The p-type electrode 9 is formed on the p-type cladding layer 6 in a ring shape surrounding the spacer layer 7 along the growth plane. The p-type cladding layer 6 is made of, for example, p-GaAs. The n-type electrode 10 is formed on the n-type cladding layer 3 in a C-shape surrounding a bottom portion of the mesa post 11 along the growth plane. The n-type cladding layer 3 is made of, for example, n-GaAs. The p-type electrode 9 and the n-type electrode 10 are electrically connected to an external circuit (e.g., current supply circuit, not shown) with a p-type lead electrode 12 and an n-type lead electrode 13, respectively.

Figure 3:
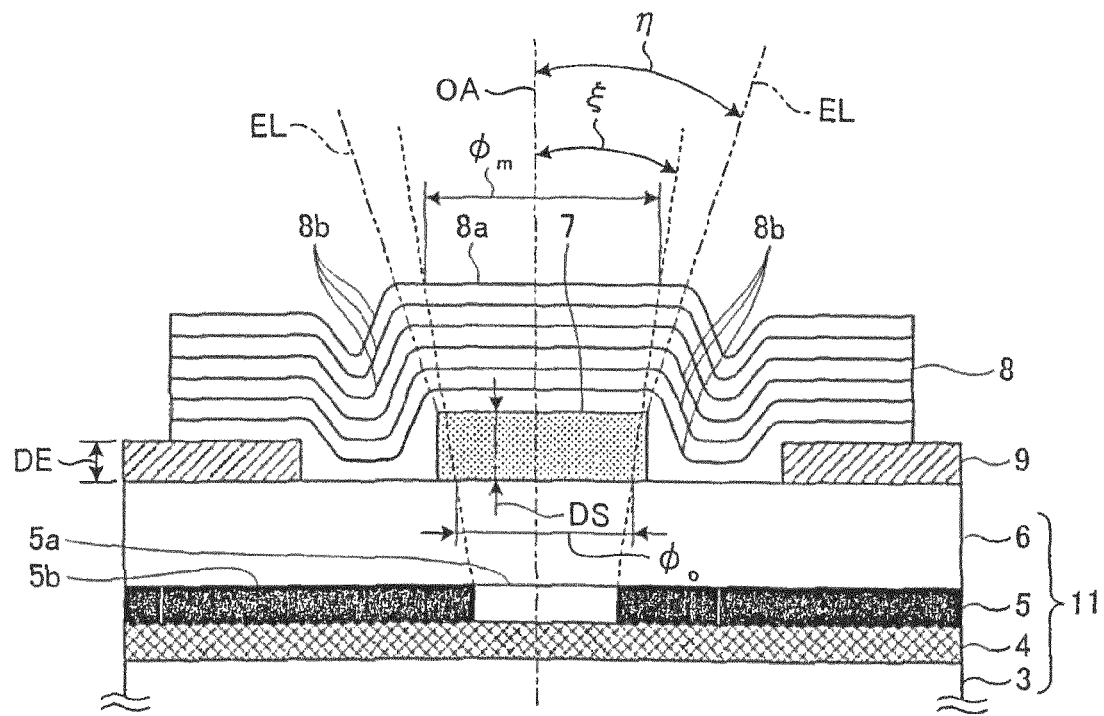
FIG. 3 is an enlarged cross section for explaining the structure on a mesa post shown in FIG. 2.

Given below is a detail explanation about the spacer layer 7 as a convex-portion forming layer formed on the p-type cladding layer 6 and the upper DBR mirror 8. FIG. 3 is an enlarged cross section for explaining the structure on the mesa post 11. The spacer layer 7 is formed with, for example, p-GaAs on the p-type cladding layer 6 above the aperture 5a in disk-shaped. The spacer layer 7 is formed along the growth plane in such a manner that an area of the spacer layer 7 is larger than an area of the aperture 5a and a spot size $\phi_0$ of the laser light at the upper surface of the p-type cladding layer 6. The spot size $\phi_0$ is decided by an aperture diameter of the aperture 5a, a predetermined diffraction angle $\xi$ of the laser light due to the aperture 5a, and a distance away from the aperture 5a, i.e., a layer thickness of the p-type cladding layer 6.

The upper DBR mirror 8 is integrally formed on the p-type cladding layer 6, the spacer layer 7, and the p-type electrode 9 as a step forming layer. Each boundary between the layers forming the upper DBR mirror 8 has a convex portion 8b above the aperture 5a along the layer shape (convex shape) of the spacer layer 7. The convex portion 8b has a plane surface formed along the growth plane in such a manner that an area of the plane surface is equal to or larger than the spot size of the laser light that is decided by the aperture diameter of the aperture 5a, the predetermined diffraction angle $\xi$ of the laser light due to the aperture 5a, and the distance away from the aperture 5a, i.e., the layer thickness measured from the upper surface of the aperture 5a.

More particularly, the exit surface 8a as the plane surface equal to or larger than a spot size $\phi_m$ of the laser light is formed on the convex portion 8b of the top layer. The plane surface is formed on each boundary between the spacer layer 7 and the exit surface 8a in such a manner that the area of each plane surface is larger than those of plane surfaces on the lower layers, increasing by a predetermined rate. A line EL connecting between the circumferences of the plane surfaces on the boundaries makes with an optical axis OA of the laser light a tilt angle $\eta$ that is equal to or larger than the predetermined diffraction angle $\xi$ of the laser light.

In other words, in the surface emitting laser device 100, the convex portion 8b having the plane surface equal to or larger than the spot size of the laser light is formed on each boundary between the layers forming the upper DBR mirror 8. The spacer layer 7 is provided between the aperture 5a and the upper DBR mirror 8 so that the tilt angle $\eta$ decided by all of the convex portions 8b is larger than the predetermined diffraction angle $\xi$. Therefore, the marginal ray of the laser light is not scattered in the surface emitting laser device 100, so that occurrence of the optical intensity loss due to the scattered marginal ray and occurrence of the disturbance in the far field pattern are prevented. The predetermined diffraction angle $\xi$ is a diffraction angle decided based on usage or the like of the surface emitting laser device 100. The predetermined diffraction angle $\xi$ is assumed as, for example, a diffraction angle corresponding to a first bright ring in a Fraunhofer diffraction image by the laser light.

Figure 4:
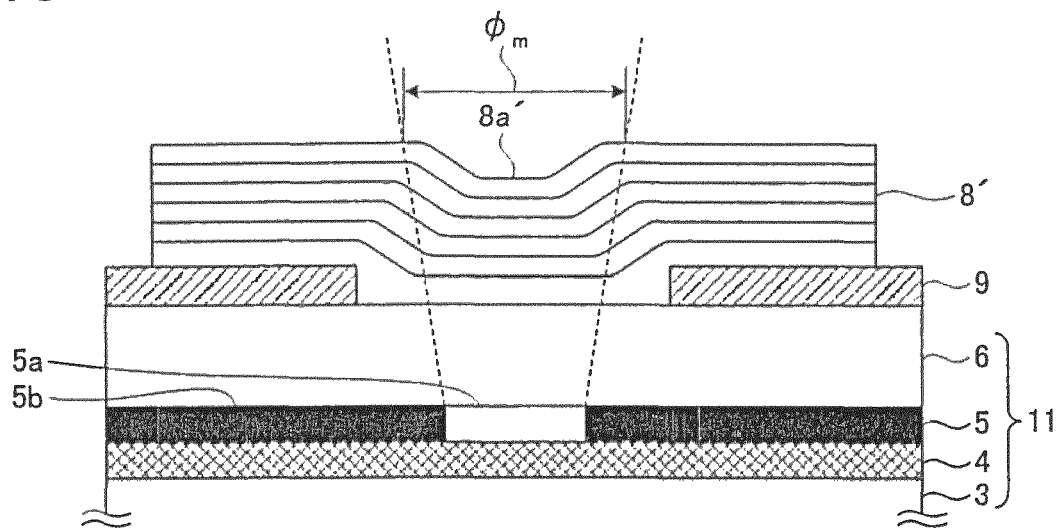
FIG. 4 is an enlarged cross section for explaining the structure on a mesa post without a spacer layer.

As shown in FIG. 4, if the spacer layer 7 is not provided so that the convex portion 8b is not formed on each boundary, an upper DBR mirror 8' formed along the layer shape of the p-type electrode 9 is obtained. In this case, the area of each plane surface above the aperture 5a is smaller than those of plane surface on the lower layers, and some upper plane surfaces are equal to or smaller than the spot size of the laser light. For example, an exit surface 8a' as the plane surface on the top layer is smaller than the spot size $\phi_m$ of the laser light. As a result, the marginal ray of the laser light becomes scattered, which causes the optical intensity loss and the disturbance in the far field pattern in the same manner as the conventional surface emitting laser device disclosed in U.S. Pat. No. 6,185,241. If the p-type electrode 9 is positioned far away along the growth surface from the aperture 5a, it is possible to prevent occurrence of the scattered marginal ray. However, the longer the distance between the aperture 5a and the p-type electrode 9 is, the higher the internal resistance against the injected current is. The higher internal resistance disadvantageously degrades the laser oscillation characteristics due to its joule-heating.

In contrast, the surface emitting laser device 100 can prevent above-described area reducing of the plane surface due to the p-type electrode 9 by forming the spacer layer 7 and thereby forming the convex portion 8b on each boundary of the upper DBR mirror 8. In other words, it is possible to form the plane surface equal to or larger than the spot size of the laser light without placing the p-type electrode 9 farther away from the aperture 5a. As a result, it is possible to emit the laser light without the scattered marginal ray within the predetermined diffraction angle ξ. To prevent the area reducing of the plane surface due to the p-type electrode 9, a layer thickness DS of the spacer layer 7 is preferably equal to or thicker than a layer thickness DE of the p-type electrode 9 as the step forming layer.

Given below is an explanation about a method of manufacturing the surface emitting laser device 100. The lower DBR mirror 2 and the n-type cladding layer 3 are sequentially formed on the substrate 1. The active layer 4, the current confinement layer 5, and the p-type cladding layer 6 are then sequentially formed as the mesa post 11. The p-type electrode 9 is formed on the p-type cladding layer 6 as a step-forming layer forming process. After that, the spacer layer 7 is formed on the p-type cladding layer 6 as a convex-portion forming layer forming process; and the upper DBR mirror 8 is formed on the p-type cladding layer 6, the spacer layer 7, and the p-type electrode 9 in a multilayer-mirror forming process. The process of forming the p-type electrode 9 can be performed after the process of forming the spacer layer 7.

In the convex-portion forming layer forming process, the spacer layer 7 is formed on the p-type cladding layer 6 above the aperture 5a in such a manner that the spacer layer 7 has a size and a thickness suitable for forming the convex portion 8b on each boundary of the upper DBR mirror 8 having the plane surface equal to or larger than the spot size of the laser light. The spot size is decided by the predetermined diffraction angle ξ of the laser light due to the aperture 5a, and the distance away from the aperture 5a. The layer thickness of the spacer layer 7 is preferably equal to or thicker than the layer thickness of the p-type electrode 9.

Although exemplary embodiments of the present invention are described above, the present invention is not limited to the above-described embodiments.

For example, although the spacer layer 7 is formed with p-GaAs in the surface emitting laser device 100, a material of the spacer layer 7 is not limited to a semiconductor. It is allowable to form the spacer layer 7 with a dielectric material such as SiN or $SiO_2$. Moreover, the spacer layer 7 can be the multilayer structure instead of the monolayer structure.

Furthermore, although the spacer layer 7 and the p-type electrode 9 are formed on the p-type cladding layer 6 in the surface emitting laser device 100, this does not mean that the spacer layer 7 and the p-type electrode 9 should be formed on the same surface. For example, it is allowable to provide another layer between the p-type cladding layer 6 and the spacer layer 7 or the p-type electrode 9.

Moreover, although a dielectric multilayer mirror is used as the upper DBR mirror 8 in the surface emitting laser device 100, a semiconductor multilayer mirror can be used as the upper DBR mirror 8.

Furthermore, although the p-type electrode 9 as the step forming layer is formed in a ring shaped surrounding the beam of the laser light and the spacer layer 7 in the surface emitting laser device 100, it is not required to perfectly surround the beam of the laser light and the spacer layer 7. It is allowable to form the spacer layer 7 in at least a portion around the beam of the laser light. The step forming layer described in the description indicates any layer including an electrode such as the p-type electrode 9 that can structurally form a step on at least a portion around the beam of the laser light.

Moreover, the surface emitting laser device 100 includes the oxidization-type current confinement layer 5. However, it is allowable to use an embedded-type current confinement layer as the current confinement layer 5.

In the surface emitting laser device including the oxidization-type current confinement layer, the laser light is diffracted mainly in an inner circumference of the selectively oxidized layer. This is because a refractive index of a non-oxidized region is smaller than a refractive index of an oxidized region, which causes difference between refractive indices in the lateral direction (radial direction) in the current confinement layer. In other words, even in a surface emitting laser device without the oxidization-type current confinement layer, if the surface emitting laser device includes a region where there is difference between refractive indices in the lateral direction, the laser light is diffracted as well. Moreover, a maximum optical confinement is obtained in a portion having the maximum difference between the refractive indices, so that the smallest spot size is obtained where the portion having the maximum difference between the refractive indices. Therefore, it is desired to improve various characteristics such as the threshold current or the consumption power by arranging the portion where the smallest spot size is obtained near the active layer, and thereby obtaining the higher optical confinement factor. The spot size at the maximum difference between the refractive indices, i.e., the smallest spot size is a size of the smallest and clearest light emitting pattern observed at a certain focal position from among patterns obtained by a Near-Field Pattern (NFP) measurement. That is, it is possible to measure the smallest spot size by performing the NFP measurement. The spot size can be measured from not only a circular light emission pattern but also a noncircular pattern such as a light emission pattern at a high-ordered mode.

Figure 5:
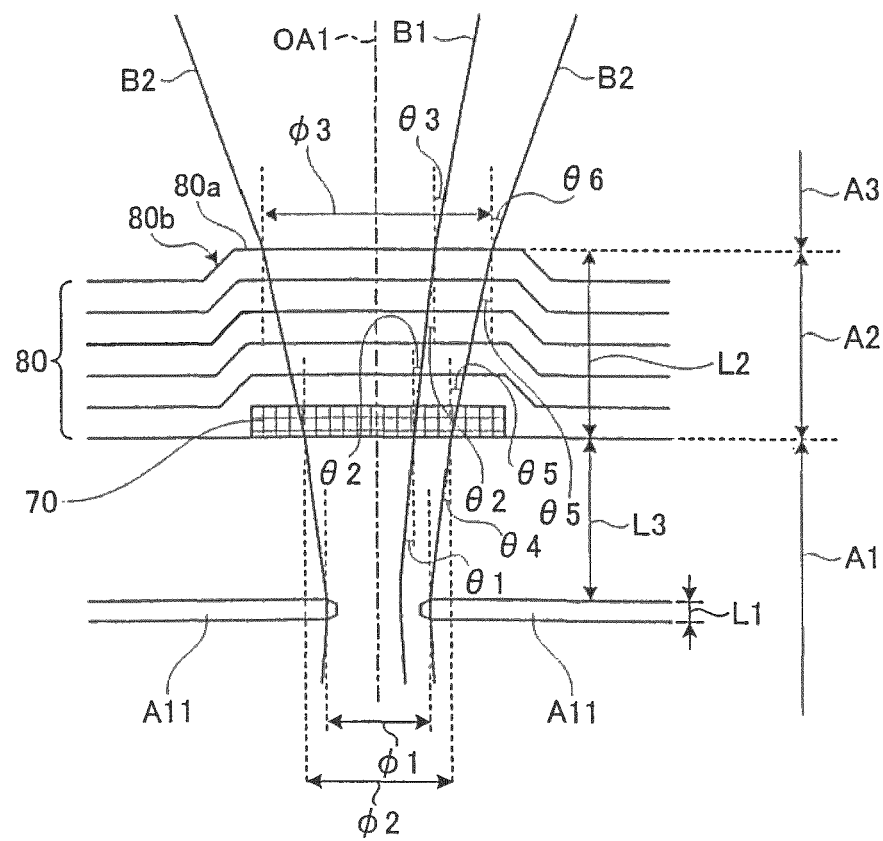
FIG. 5 is a schematic diagram for explaining a method of measuring a spot size.
Figure 6:
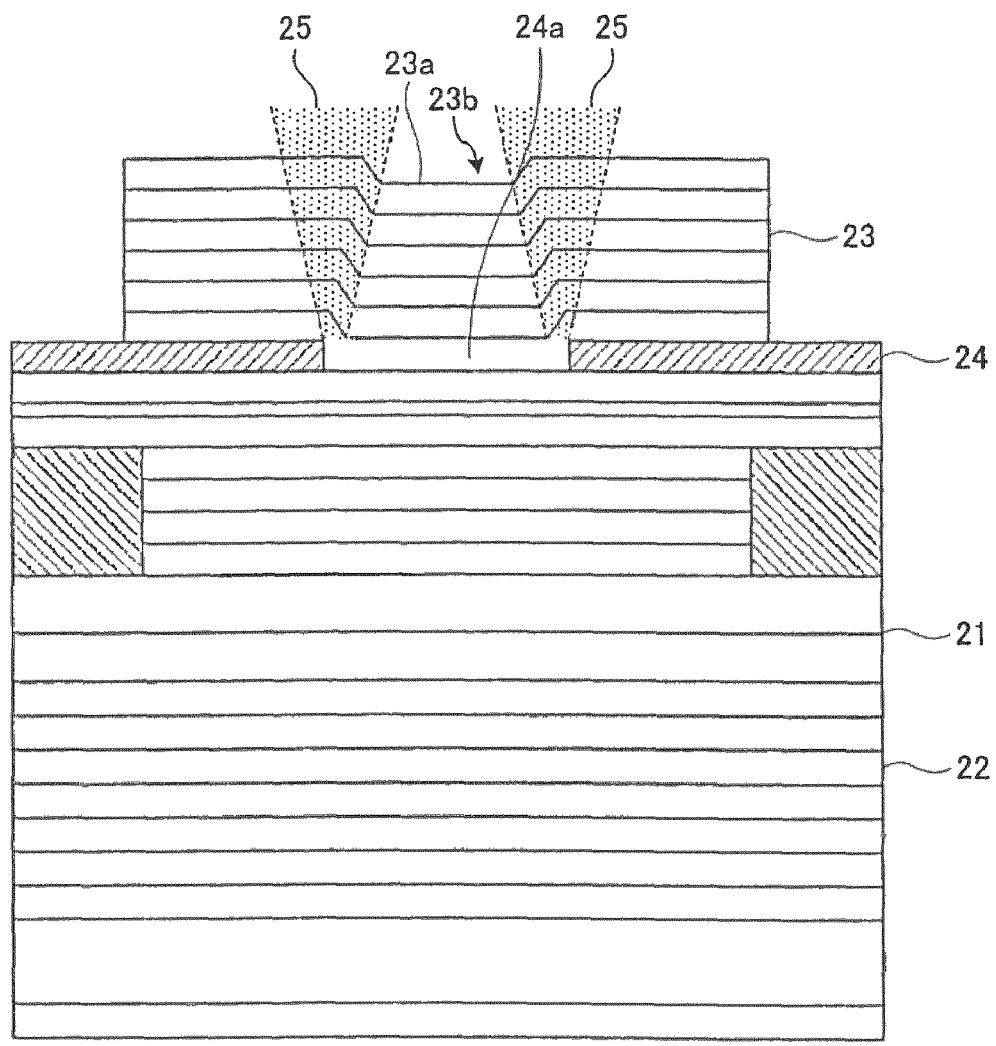
FIG. 6 is a cross section of a conventional surface emitting laser device.

Given below is an explanation about a method of measuring the spot size of the laser light at the convex-portion forming layer and the surface of the surface emitting laser device. FIG. 5 is a schematic diagram for explaining a method of measuring the spot size. As shown FIG. 5, there defined, near a surface of a surface emitting laser device having the structure same as the surface emitting laser device shown in FIG. 1, a semiconductor region A1 including a low refraction region A11, a dielectric DBR mirror 80 including an exit surface 80a and a convex portion 80b, a dielectric DBR region A2 including a convex-portion forming layer 70, and an air region A3. In a light travelling along an optical path B1 from a lower portion to an upper portion in the sheet, an incident angle and an exit angle at a boundary between the semiconductor region A1 and the dielectric DBR region A2 are an angle θ1 and an angle θ2, respectively; an incident angle and an exit angle at a boundary between the dielectric DBR region A2 and the air region A3 are the angle θ2 and an angle θ3, respectively; and the light emits from the surface of the dielectric DBR mirror 80 at the angle θ3. The angles θ1 to θ3 are measured with respect to an optical axis OA1.

A Far-field Pattern (FFP) measurement is generally used to measure an exit angle of a light emitted from a device. In the typical FFP measurement, a detector with a slit is arranged about 100 mm away from the surface of the device and is rotated around the device for measurement. Because an optical length at the detector in the FFP measurement is about 100 mm as compared to a thickness of the device is 100 mm to several hundred μm, the thickness of the device can be ignored, that is, it is possible to assume the light emission portion as a point light source. Therefore, the exit angle of the light travelling the optical path B1 is experimentally observed as the angle θ3 in the FFP measurement. The exit angle of the light emitted from the device is decided in the typical FFP angle profile as an angle at a position where the light intensity is attenuated by $1/e^2$ (where e is a base of a natural logarithm) from its maximum value. The exit angle from the surface emitting laser device is generally within a range from several degrees to varying numbers of degrees. As shown in FIG. 5, an optical path B2 has an exit angle θ6 decided as described above. In the optical path B2, an incident angle and an exit angle at the boundary between the semiconductor region A1 and the dielectric DBR region A2 are an angle θ4 and an angle θ5, respectively. The spot size of the laser light is a distance between the optical axis OA1 and the optical path B2 in the radium direction.

Average refraction indices of the dielectric DBR region A2, the semiconductor region A1, the low refraction region A11, and the air region A3 are assumed as $n_d$, $n_s$, $n_l$, and $n_a$, respectively. A thickness L2 of the dielectric DBR region A2 and a thickness L1 of the low refraction region A11 are $L_d$ and $L_l$, respectively. A distance L3 between an upper surface of the low refraction region A11 in the semiconductor region A1 and a lower surface of the dielectric DBR region A2 is $L_s$. If values of the angle θ4, the angle θ5, and the exit angle θ6 concerning the optical path B2 are $\theta_{smax}$, $\theta_{dmax}$, and $\theta_{amax}$, respectively, the relations between the angles are as follows:

$$n_a \sin \theta_{smax} = n_d \sin \theta_{dmax} \quad (1)$$

and $$n_d \sin \theta_{dmax} = n_s \sin \theta_{smax} \quad (2)$$

Therefore, $\theta_{dmax}$ and $\theta_{smax}$ are calculated by using the refraction indices $n_d$ and $n_s$, the $\theta_{amax}$ measured by the FFP measurement, and above Equations (1) and (2). A value $D_{min}$ that is a value of the smallest spot size φ1 is calculated by the NFP measurement as described above. Therefore, the spot size at each region can be calculated from $D_{min}$. For example, a value $D_{step}$ that is a value of the spot size φ2 at the lower surface of the convex-portion forming layer 70 is calculated by following Equation (3) additionally using a value $L_s$:

$$D_{step} = 2\left(\frac{1}{2}D_{min} + L_s \tan\theta_{smax}\right) \quad (3)$$

While, a value $D_{top}$ that is a value of the spot size φ3 at the exit surface 80a is calculated by following Equation (4) still additionally using a value $L_d$:

$$D_{top} = 2\left(\frac{1}{2}D_{step} + L_d \tan\theta_{dmax}\right) \quad (4)$$

As described above, according to an aspect of the present invention, it is possible to obtain a surface emitting laser device suitable for a device used in the field of optical interconnections or optical communications.

Further effect and modifications can be readily derived by persons skilled in the art. Therefore, a more extensive mode of the present invention is not limited by the specific details and the representative embodiment. Accordingly, various changes are possible without departing from the spirit or the scope of the general concept of the present invention defined by the attached claims and the equivalent.

What is claimed is:

1. A surface emitting laser device that includes an active layer, a current confinement layer, and a multilayer mirror formed on a substrate, and emits a laser light through a current-confinement aperture of the current confinement layer and the multilayer mirror, the surface emitting laser device comprising:
   a convex-portion forming layer that is formed between the current-confinement aperture and the multilayer mirror, and forms a convex portion on each boundary between layers forming the multilayer mirror, wherein
   the convex portion includes a plane equal to or larger than a spot size of the laser light, and
   the spot size is decided by a diameter of the current-confinement aperture, a predetermined diffraction angle of the laser light due to the current-confinement aperture, and a distance from the current-confinement aperture.

2. The surface emitting laser device according to claim 1, further comprising:
   a step forming layer that forms a step in vicinity of the convex-portion forming layer either on a growth surface of the convex-portion forming layer or on a nearby surface of the convex-portion forming layer, wherein
   the multilayer mirror is integrally formed on the convex-portion forming layer and the step forming layer.

3. The surface emitting laser device according to claim 2, wherein a layer thickness of the convex-portion forming layer is equal to or larger than a layer thickness of the step forming layer.

4. The surface emitting laser device according to claim 2, wherein the step forming layer is an electrode for injecting a current into the active layer through the current-confinement aperture.

5. The surface emitting laser device according to claim 3, wherein the step forming layer is an electrode for injecting a current into the active layer through the current-confinement aperture.

6. A method of manufacturing a surface emitting laser device that includes an active layer, a current confinement layer, and a multilayer mirror formed on a substrate, and emits a laser light through a current-confinement aperture of the current confinement layer and the multilayer mirror, the method comprising:
   forming a convex-portion forming layer between the current-confinement aperture and the multilayer mirror to forms a convex portion on each boundary between layers forming the multilayer mirror, wherein the convex portion includes a plane equal to or larger than a spot size of the laser light, and the spot size is decided by a diameter of the current-confinement aperture, a predetermined diffraction angle of the laser light due to the current-confinement aperture, and a distance from the current-confinement aperture; and
   forming the multilayer mirror on the convex-portion forming layer.

7. The method according to claim 6, further comprising:
   forming a step forming layer to form a step in vicinity of the convex-portion forming layer either on a growth surface of the convex-portion forming layer or on a nearby surface of the convex-portion forming layer, wherein
   the forming the multilayer mirror includes forming the multilayer mirror integrally on the convex-portion forming layer and the step forming layer.

8. The method according to claim 7, wherein the forming a convex-portion forming layer includes forming a convex-portion forming layer with a layer thickness equal to or larger than a layer thickness of the step forming layer.

* * * * *